(12) United States Patent
Harris

(10) Patent No.: US 8,309,893 B2
(45) Date of Patent: Nov. 13, 2012

(54) SWITCHING APPARATUS AND CONTROLLER FOR AN ELECTRIC APPLIANCE THAT PROMOTES EXTENDED RELAY LIFE

(75) Inventor: Robert C. Harris, Springfield, TN (US)

(73) Assignee: Electrolux Home Products, Inc., Charlotte, NC (US)

( * ) Notice: Subject to any disclaimer, the term of this patent is extended or adjusted under 35 U.S.C. 154(b) by 629 days.

(21) Appl. No.: 12/391,546

(22) Filed: Feb. 24, 2009

(65) Prior Publication Data

US 2010/0213184 A1    Aug. 26, 2010

(51) Int. Cl.
*H05B 1/02* (2006.01)
*H05B 3/02* (2006.01)
*H03K 17/04* (2006.01)
*H03K 17/0812* (2006.01)

(52) U.S. Cl. ........ 219/519; 219/414; 219/493; 219/494; 219/497

(58) Field of Classification Search .................... None
See application file for complete search history.

(56) References Cited

U.S. PATENT DOCUMENTS

| 4,151,387 | A | * | 4/1979 | Peters, Jr. ................... 219/626 |
| 4,527,049 | A | | 7/1985 | Thomas et al. |
| 6,246,831 | B1 | * | 6/2001 | Seitz et al. .................... 392/486 |
| 7,304,274 | B2 | * | 12/2007 | Larson et al. ................. 219/501 |
| 2011/0095017 | A1 | * | 4/2011 | Steurer .......................... 219/493 |

FOREIGN PATENT DOCUMENTS

| GB | 2105127 | | 3/1983 |
| JP | 2001053595 | * | 2/2001 |

OTHER PUBLICATIONS

Baumann D. D.: "Push-Push inverter using a single-ended input" IBM Technical Disclosure Bulletin, vol. 9, No. 10, Mar. 23, 1967.
International Search Report for PCT/US2010/022839, dated Aug. 4, 2010, 2 pages.

* cited by examiner

*Primary Examiner* — Joseph M Pelham
(74) *Attorney, Agent, or Firm* — Pearne & Gordon LLP

(57) ABSTRACT

A heating appliance includes an electric heating element, and a relay for selectively connecting the heating element to a power supply that supplies an alternating electric current to the electric heating element to generate heat. The relay includes an inductive actuator that controls a switching state of the relay, and a switch can interrupt a supply of electric current from a power source to the inductive actuator to adjust the switching state. A flyback path for conducting a decaying electric current includes a selective conductor and a voltage regulator that maintains a flyback voltage across the inductive actuator above a minimum flyback voltage. And a controller transmits a control signal that adjusts the switching state of the relay to cause interruption of the alternating electric current being supplied to the heating element after the alternating electric current being conducted through the relay falls below a peak value.

13 Claims, 2 Drawing Sheets

SWITCHING APPARATUS AND CONTROLLER FOR AN ELECTRIC APPLIANCE THAT PROMOTES EXTENDED RELAY LIFE

TECHNICAL FIELD

This application relates generally to an electric cooking appliance, and more specifically, to a relay driver for controlling operation of a relay to selectively establish and break an electric connection between a heating element of an electric cooking appliance and an energy source.

BACKGROUND OF THE INVENTION

Electric cooking appliances such as ovens, for example, have traditionally included a heating element that, when supplied with electric energy generated a sufficient amount of heat to cook food. Due to the high power demands of the heating element, isolation devices have typically been employed between sensitive control circuitry and the high-power components associated with the heating element. The isolation devices insulate the control circuit components from the high power being delivered to the heating element.

One such isolation device commonly found on electronic cooking appliances is a relay. A relay is simply an electrical switch that uses an electromagnet to selectively toggle the high-power supply on and off to respectively activate and deactivate the heating element while cooking. Electric current flows through a coil to generate a magnetic field that, in turn, pulls a magnetic switching element such as a metallic armature into contact with one or more terminals of the high-power circuit including the heating element. This contact between the switching element and the terminal(s) of the high-power circuit closes the high-power circuit (for a normally-open relay), thereby supplying the high-voltage and/or high-current electric energy to the heating element. Inducing a magnetic field in such a manner allows the relay to close the high-power circuit without establishing a conductive pathway to the more-sensitive control circuit that controls the operational state of the relay, thereby isolating the two circuits.

Although the relay provides sufficient isolation to protect the control circuit from the high power of the circuit including the heating element, the relay has its own shortcomings that can limit its application in consumer goods such as cooking appliances. In a cooking appliance, the relay will be cycled on and off thousands of times, if not more, during its lifetime to control the delivery of the high AC voltages required to energize the heating element and maintain a user-selected cooking temperature. If the relay opens the circuit delivering the high AC voltage to the heating element while the voltage waveform is at or near its peak value, then a considerable arc will be generated between the relay contacts when the high-power circuit is opened. Arcing damages the relay contacts and can eventually shorten the relay's useful life if repeatedly subjected to such arcs.

In order to minimize arcing experienced between the relay contacts, efforts have been made to time the opening of the relay to correspond to the zero-crossing of the AC voltage waveform. However, the relay coil is also an inductor that stores electric energy and resists rapid changes in the current flowing through the relay coil with respect to time. The resistance to instantaneous changes in current flowing through the relay coil makes the relay slow to open, which can extend the length of time that an arc extends between the relay's contacts. Some relays have been designed to open rapidly to minimize the time an arc exists between its contacts, but such relays are expensive, making them impractical for use in cooking appliances. Other relays, although cheaper, take many (often more than 10) milliseconds to open. But since each half cycle of a 60 Hz AC voltage waveform lasts about 8.3 milliseconds, each time the high-power circuit is opened, the arc will experience at least one peak voltage across the relay's contacts, and possibly more. An arc between the contacts at the peak voltage of the AC waveform imparts the most damage on the contacts, and significantly shortens the useful life of the relay.

Accordingly, there is a need in the art for a cooking appliance with improved electrical isolation between control and high-power circuits to minimize damage to the electrical isolation device while transitioning between on and off states.

SUMMARY

According to one aspect, the subject application involves a heating appliance for elevating the temperature of a food item. Such a heating appliance includes an electric heating element that generates heat in response to conducting an electric current, and a support to be coupled to the heating appliance adjacent to the electric heating element for supporting the food item within a suitable proximity to the electric heating element to expose the food item to heat from the electric heating element. A relay is to be electrically connected to the electric heating element for controlling a supply of the electric current to the electric heating element. The relay includes a coil that can be energized to actuate a switching element that is operable to open and close a conductive pathway for selectively conducting the electric current for generating heat. A switch can be provided for electrically connecting the coil of the relay to a power source for actuating the switching element. A selective conductor is to be electrically connected to the coil for establishing a flyback path that conducts a decaying electric current when the coil of the relay is de-energized. The selective conductor minimizes conduction of the electric current from the power source through the flyback path while the coil is energized. A voltage regulator can be provided for maintaining a voltage across the coil at a level above a minimum flyback voltage in response to electrical disconnection of the coil of the relay from the power source. A controller can also be provided for transmitting a control signal to interrupt the conductive pathway established by the switch, in response to a command to interrupt the supply of electric current to the heating element.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

BRIEF DESCRIPTION OF THE DRAWINGS

The invention may take physical form in certain parts and arrangement of parts, embodiments of which will be described in detail in this specification and illustrated in the accompanying drawings which form a part hereof and wherein.

DETAILED DESCRIPTION

Figure 1:
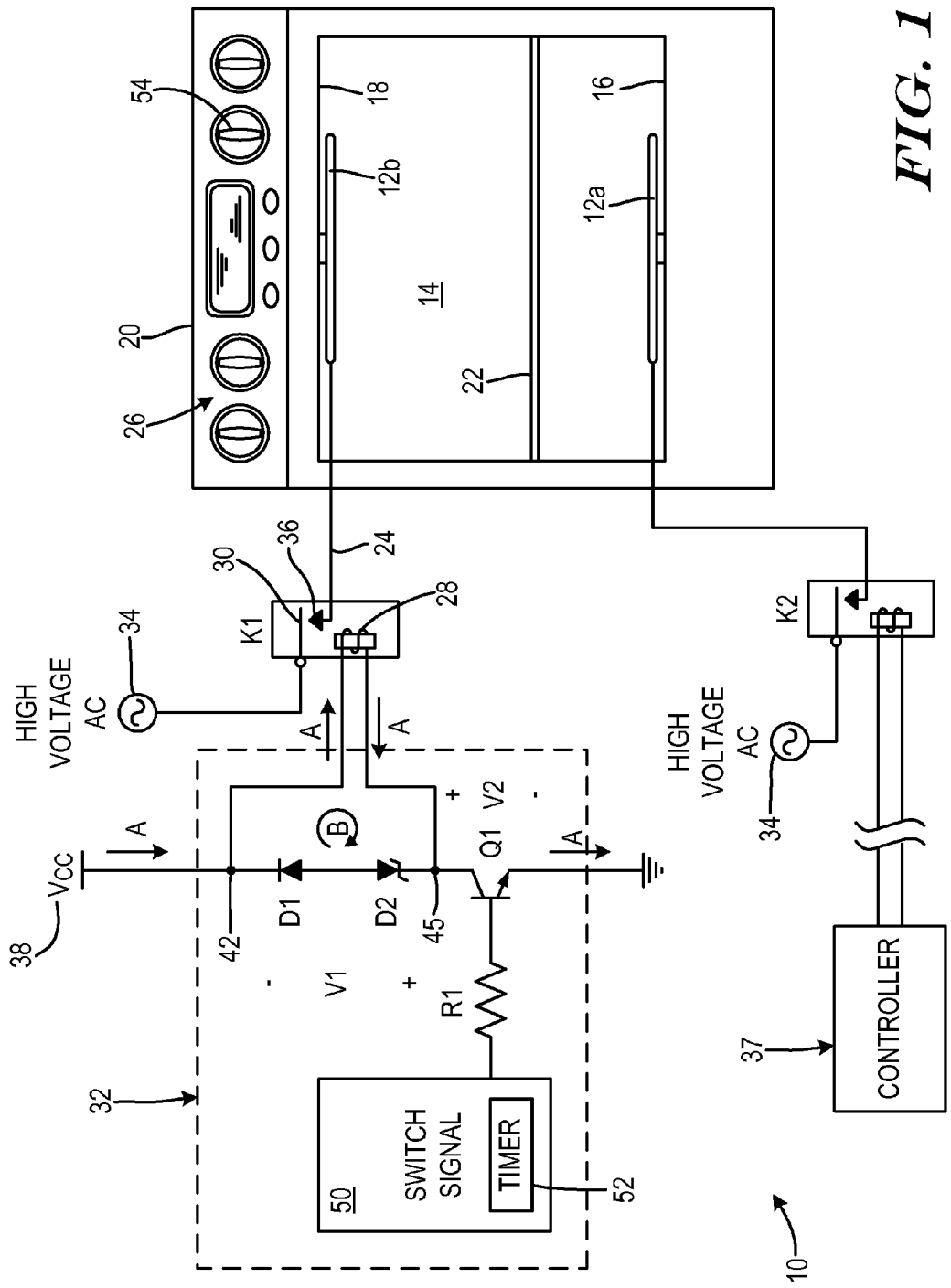
FIG. 1 is an illustrative embodiment of a heating appliance including a controller for interrupting a supply of electric current to a heating element provided to the heating appliance for elevating a temperature of a food item.

Certain terminology is used herein for convenience only and is not to be taken as a limitation on the present invention. Relative language used herein is best understood with reference to the drawings, in which like numerals are used to identify like or similar items. Further, in the drawings, certain features may be shown in somewhat schematic form.

It is also to be noted that the phrase "at least one of", if used herein, followed by a plurality of members herein means one of the members, or a combination of more than one of the members. For example, the phrase "at least one of a first widget and a second widget" means in the present application: the first widget, the second widget, or the first widget and the second widget. Likewise, "at least one of a first widget, a second widget and a third widget" means in the present application: the first widget, the second widget, the third widget, the first widget and the second widget, the first widget and the third widget, the second widget and the third widget, or the first widget and the second widget and the third widget.

The subject application relates to a heating appliance 10 for cooking, heating, or otherwise elevating a temperature of a food item (not shown) to a desired temperature above ambient temperature. The embodiment of the heating appliance 10 shown in FIG. 1 includes at least one electric heating element such as a bake element 12a within an oven chamber 14 and disposed near a floor 16 of said oven chamber 14, a broil element 12b within the oven chamber 14 and disposed near a ceiling 18, or both, for example. The heating appliance can alternately include a cooktop element provided adjacent to a substantially horizontal cooktop surface 20 exposed atop of the heating appliance 10. The bake element 12a, broil element 12b, cooktop element and any other heating element can each independently be selected as a CalRod element, Nichrome wire element, or any other suitable heating element that can convert electric energy into heat.

For the sake of clarity, an embodiment of the heating appliance 10 including both a bake element 12a and a broil element 12b will be described in detail below. However, the heating appliance 10 can include only the bake element 12a, only the broil element 12b, only the cooktop element, any combination thereof, or any other suitable heating element provided to a heating appliance 10 such as a range, oven only, cooktop only, or any other such appliance for heating food items. The one or more heating elements, including the bake and broil elements 12a, 12b, for example, can each be independently selected as a CalRod element, Nichrome wire element, or any other suitable heating element that can generate heat in response to conducting an electric current.

A support such as a shelf 22 is to be coupled to the heating appliance 10 adjacent to the bake and broil heating elements 12a, 12b for supporting the food item within the oven, for example. For such an embodiment, the food item on the shelf 22 is supported within a suitable proximity to the bake and broil heating elements 12a, 12b so that it can be exposed to heat from the bake and broil heating elements 12a, 12b while cooking. A glass panel can optionally be placed over a cooktop element to support cookware above the cooktop element. According to yet other embodiments, the support can include a surface of the cooktop element itself, upon which cookware can be placed to conduct heat directly to the cookware, for example.

A relay K1 in FIG. 1 is electrically connected to the broil element 12b by a circuit including suitable-gauge, electrically-conductive wires 24. Although FIG. 1 shows the relay K1 for establishing an electrical connection between the high-voltage AC source 34 and the broil element 12b, it is to be understood that the present invention can optionally include a relay K2, instead of or in addition to relay K1, for establishing an electrical connection between the source 34 and the bake element 12a. The relays K1, K2 can optionally be operable to establish their respective electrical connection independent of the other relay, or can be coordinated to operate synchronously. As discussed in detail below, a controller 32 is provided to control operation of the relay K1, and another, separate controller 37 that is similar to, or the same as controller 32 can be provided to control operation of relay K2, which can optionally be similar to, or the same as relay K1. According to alternate embodiments, the controller 32 can be operatively coupled to communicate with both relays K1, K2 to control operation of both of those relays as described below. According to other embodiments, each of the plurality of relays K1, K2 can optionally be operatively coupled to its own respective circuit including a flyback path B (flyback path B is described in detail below), wherein a common switching signal generator 50 is provided to selectively electrically connect the flyback path B of each respective circuit to control interruption of high-voltage AC electric current to a plurality of different heating elements 12a, 12b. For the sake of clarity and brevity, however, an operation of an embodiment including the controller 32 controlling operation of the broil element 12b is discussed in detail below.

The relay K1 is operable to control a supply of electric current to the broil heating element 12b to provide the desired heat output as selected by a user via a user interface 26. For the embodiment shown in FIG. 1, the relay K1 includes a coil 28 that can be energized with electric current to actuate a switching element 30 between open and closed positions. The relay K1, through proper positioning of the switching element 30, can open and close the circuit including the wires 24 to selectively conduct an electric current through the broil heating element 12b for generating the heat required to cook or otherwise elevate the temperature of the food item.

The relay K1 can be normally open or normally closed, and controlled accordingly to selectively and electrically connect the broil heating element 12b to a source 34 of high-power AC electric current, such as a 240 $V_{RMS}$ AC mains outlet for example. The relay K1 can also electrically isolate a controller 32 and its relatively-low power electronic circuitry from the comparatively high-power electric current conducted through the broil heating element 12b.

For embodiments utilizing a normally-open relay K1 such as that shown in FIG. 1, the switching element 30 is separated, and electrically isolated from a contact 36 that is electrically connected to the broil heating element 12b. In this position the circuit including the source 34 and the broil heating element 12b is open, and thus, electric current is not being conducted through the broil heating element 12b to generate heat. When the coil 28 is electrically connected to a DC (or other suitable) power source 38 (i.e., when the circuit including the coil 28 and power source 38 is closed) the current conducted through the coil 28 generates a magnetic field. The magnetic field magnetically attracts the switching element 30 towards the contact 36 until the switching element 30 reaches the closed position, physically touching the contact 36 and establishing an electric connection there between.

When it is desired to de-energize the broil heating element 12b, the supply of electric current to the broil heating element 12b is discontinued by returning the switching element to its open position. To accomplish this, the electric current being conducting through the coil 28 to generate the magnetic field is interrupted. A switch Q1 is provided to the controller 32 for electrically connecting and disconnecting the coil 28 of the relay K1 to the power source 38 for actuating the switching element 30. The switch Q1 can be an electrically-actuated switching device such as a transistor, solid-state relay, and the like and, when closed, can close the circuit including the power source 38 and the coil 28. When the switch Q1 is closed to electrically connect the power source 38 and the coil 28, the electric current can be conducted along path A in FIG. 1.

A selective conductor D1, shown in FIG. 1 as a diode, is reverse biased by the power source 38 when the switch Q1 is closed. Thus, the selective conductor D1 creates a large resistance to the flow of electric current in a flyback path B at node 42, thereby encouraging the electric current to follow the path of least resistance through the coil 28 and thus generating the magnetic field. The selective conductor D1 is said to be "selective" in that it poses a significant resistance to the flow of electric current when reverse biased (i.e., when a voltage at the cathode is greater than a voltage at the anode in the case of a diode), and poses a minimal resistance to the flow of electric current when forward biased. Also, for embodiments utilizing a diode as the selective conductor D1, the diode is a solid-state, naturally commutated and electrically controlled switch disposed in series within the flyback path B.

As with any inductor, the coil 28 tends to resist changes in the electric current it is conducting. Due to the inductance of the coil 28, the current conducted through the coil 28 after the switch Q1 is opened gradually decays over time while the magnetic field dissipates. Thus, the electric current being conducted through the coil 28 continues to exist along with a voltage, referred to as a flyback voltage V1, across the coil 28 even after the switch Q1 is opened. When the switch Q1 is opened, the coil 28 begins to be de-energized, and the flyback voltage V1 is established across the selective conductor D1 and a voltage regulator D2, which is discussed in detail below. The polarity of the flyback voltage V1 established when the switch Q1 is opened is the opposite of the polarity of the voltage across the selective conductor D1 and voltage regulator D2 when the switch Q1 is closed. The polarity of the flyback voltage V1 is such that it causes the selective conductor D1 to become forward biased, thereby electrically connecting the flyback path B to the coil 28 to form a conductive loop through which the electric current can be conducted as the electric current, and accordingly the magnetic field, decays. And since the switch Q1 is open, the path of least resistance for the decaying electric current becomes the flyback path B at node 45.

The effect of the coil's inductance in resisting changes to the flow of current through the coil 28 can be minimized by maintaining the voltage V1 across the coil 28 to be as large as possible without creating a voltage V2 across the switch Q1 that is large enough to damage the switch Q1. The flyback voltage V1 can be maintained at a value such that the voltage V2 across the switch Q1 is maintained below a maximum CE voltage, and optionally below a rated CE voltage of the particular transistor used as switch Q1, for example. The rate at which the electric current being conducted through the coil 28 can dissipate (and thereby allow the magnetic field to dissipate and release the switching element to return to its open position) varies proportionally with the magnitude of the flyback voltage V1 across the coil 28. Thus, the larger the flyback voltage V1, the faster the electric current being conducted through the coil 28 via the flyback path B can decay enough to weaken the magnetic field to a point where the switching element of the relay K1 is released to its open position to interrupt the flow of electric current to the broil heating element 12b.

The voltage regulator D2 can be provided in series within the flyback path B for maintaining the flyback voltage V1 across the coil 28 at a level above a minimum flyback voltage in response to electrical disconnection of the coil 28 of the relay K1 from the power source 38 when the switch Q1 is opened. The minimum flyback voltage can be chosen to be approximately equal to the maximum voltage for minimizing the time required for the electric current to decay in the coil 28 to a point where the magnetic field allows the switching element 30 to return to its open position without establishing a voltage across the switch Q1 that will significantly damage the switch Q1, or cause the switch Q1 to breakdown. Such a minimum flyback voltage can be chosen such that the voltage V2 across the switch Q1 is slightly less than the rated maximum repetitive reverse breakdown voltage of the switch Q1.

According to alternate embodiments, the switch Q1 and voltage regulator D2 can be selected to establish a minimum flyback voltage across the coil 28 to allow the decaying electric current to sufficiently decay to free the switching element 30 from the magnetic field and interrupt the supply of electric current to the broil heating element 12b in less than about three (3 msec.) milliseconds from when a command to interrupt the supply of electric current is received by the controller 32. Other embodiments include a switch Q1 and voltage regulator D2 combination that can interrupt the supply of electric current to the broil heating element 12b in less than about two (2 msec.) milliseconds from when a command to interrupt the supply of electric current is received by the controller 32. Yet other embodiments include a switch Q1 and voltage regulator D2 combination that can interrupt the supply of electric current to the broil heating element 12b within a range from about 2.35 (msec.) milliseconds to about 2.95 (msec.) milliseconds from when a command to interrupt the supply of electric current is received by the controller 32.

According to alternate embodiments, the switch Q1 and voltage regulator D2 can be selected based on the predetermined frequency of the AC electric current being supplied to the broil heating element 12b. The switch Q1 and voltage regulator D2 can be selected to establish a minimum flyback voltage V1 across the coil 28 that is suitable to allow the decaying electric current to sufficiently decay to release the switching element 30 from the magnetic field to open the relay K1 in less than one half cycle of the AC electric current at that predetermined frequency from when the command to interrupt the supply of electric current is received by the controller. Thus, enhanced control of the interruption of the AC electric current to the broil heating element 12b can be achieved to avoid interrupting the AC electric current at, or near a peak value of the waveform.

Figure 2:
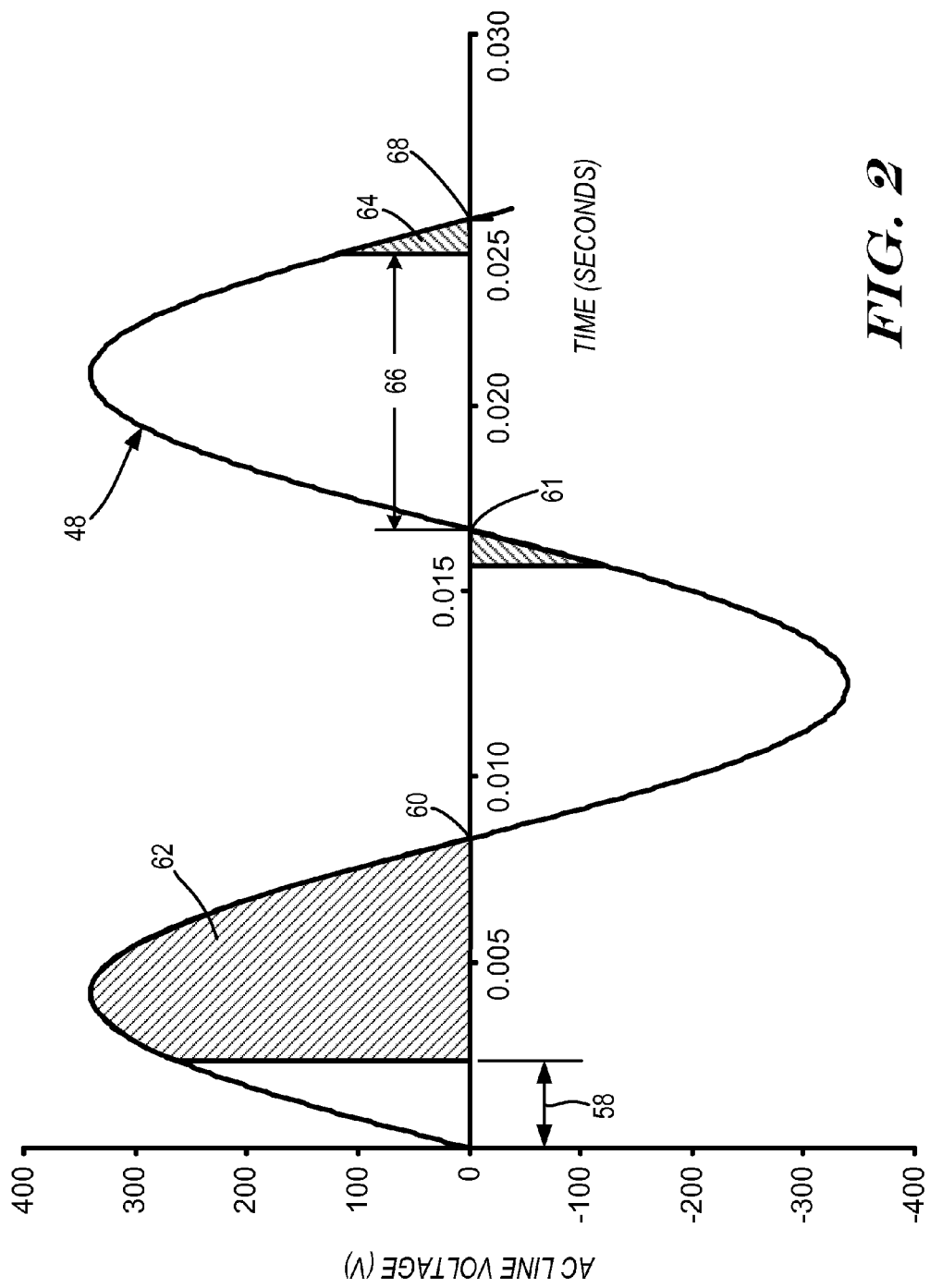
FIG. 2 is an illustrative AC line voltage waveform to be supplied to a heating element provided to a heating appliance.

For example, for a 60 Hz AC waveform 48, such as that shown in FIG. 2, each complete cycle lasts approximately 0.0167 seconds (16.7 msec.), the first of which being indicated by zero crossing 61 (assuming that the cycle began at t=0). Likewise, each half cycle lasts approximately 0.0083 seconds (8.3 msec.), the first of which being indicated by zero crossing 60. The command to interrupt the supply of electric current to the broil heating element 12b can be issued anytime during the first half cycle of the waveform 48, and the decaying current through the flyback path B and coil 28 can sufficiently decay to open the relay and interrupt the supply of electric current to the broil heating element 12b before the end of that half cycle at zero crossing 52.

The embodiment of the voltage regulator D2 shown in FIG. 1 includes a Zener diode connected in series with the selective conductor within the flyback path B. A Zener diode is a type of solid-state diode that conducts current in the forward direction similar to the diode embodiment of the selective conductor D1, but also in the reverse direction if the reverse-bias voltage exceeds the Zener diode's breakdown voltage. Thus, the Zener diode exhibits significant resistance to conducting electric current until the reverse-bias voltage exceeds the breakdown voltage, at which point the Zener diode maintains the voltage of the conducted electric current at, or near the breakdown voltage. Similarly, as the reverse-bias voltage applied across the Zener falls below the reverse breakdown voltage, the Zener diode rapidly forms a large impedance to the flow of electric current. This essentially eliminates the flyback voltage V1 across the coil 28, rapidly dropping the flyback voltage V1 across the coil 28 to an unbiased level.

An example of a suitable combination of a selective conductor D1, voltage regulator D2 and switch Q1 for a given power source 38 is as follows:

TABLE 1

| power source 38 | 16 VDC |
|---|---|
| selective conductor D1 | 1N4148 |
| voltage regulator D2 | 1N5245 |
| switch Q1 | 2N4401 |

For a power source 38 of 16 VDC as in the present example, the voltage drop across the selective conductor D1 is about 0.7 VDC. Thus, without the voltage regulator D2, the collector-emitter potential with reference to ground as shown in FIG. 1 would be about 16.7 VDC. However, the 2N4401 switch Q1 can withstand a collector-emitter potential difference of about 40 VDC. Under such conditions, bench tests conducted at room temperature and with a T77 relay K1 revealed relay turn-off times from about 5.6 (msec.) milliseconds to about 5.7 (msec.) milliseconds. The relay turn-off time is the time from when the switch Q1 is opened to disconnect the coil 28 from the power source 38 to a time when the magnetic field generated from the coil 28 dissipates sufficiently to enable the relay K1 to electrically disconnect the broil heating element 12b from the source 34.

Further according to the present example, with the voltage regulator D2 included in series with the selective conductor D1 as shown in FIG. 1, similar bench tests were conducted. Again, the bench tests were conducted using the components in Table 1 at room temperature with a T77 relay K1 and a power source of 16 VDC. Also, since the voltage drop across the 1N5245 voltage regulator D2 is about 15 VDC, the collector-emitter voltage experienced by the switch Q1 is about 31.7 VDC, much closer to the 40 VDC rated collector-emitter voltage of the 2N4401 switch Q1. Such bench tests resulted in relay turn-off times from about 1.55 (msec.) milliseconds to about 1.6 (msec.) milliseconds. Accordingly, the relay turn-off times were shortened to less than a third (⅓) of the relay turn-off times observed without the voltage regulator D2.

The controller 32 includes a signal generator 50 for transmitting a control signal to interrupt the conductive pathway established by the switch Q1 in response to the issuance of a command to interrupt the supply of electric current being delivered to the broil heating element 12b. For example, the command to interrupt the supply of electric current to the broil heating element 12b can optionally be issued once a predetermined period of time expires. The user of the heating appliance 10 can input a desired baking temperature, for example, via a knob 54 or other input device provided to the user interface 26. Each temperature setting that can be selected by the knob 54 can correspond to different cycle times for establishing and interrupting the supply of electric current to the bake and broil heating elements 12a, 12b. For instance, selecting a 350° F. broil temperature can correspond to delivering electric current to the broil heating element 12b for ten (10 sec.) seconds followed by a period of about ten (10 sec.) seconds during which the supply of electric current to the broil heating element 12b is interrupted. If a higher temperature setting is selected via the knob 54, the proportion of time during which the supply of electric current is established to the time during which the supply of electric current is interrupted can be increased (i.e., on longer and off shorter). Similarly, if a lower temperature setting is selected via the knob 54, the proportion of time during which the supply of electric current is established to the time during which the supply of electric current is interrupted can be decreased (i.e., on shorter and off longer). A similar timing algorithm can alternately be applied to the supply of electric current to one or more cooktop elements according to alternate embodiments.

A timing circuit 52 operatively connected to the signal generator 50 can issue the command occasionally based on the temperature or other cooking setting input via the knob 54 or other input device provided to the user interface 26. The timing circuit 52 can be operatively connected to receive the input from the user interface 26 and issue the appropriate command to control operation of the switch Q1. Due to the rapid relay turn-off time that can be achieved by including the voltage regulator D2, the window of time available for interrupting the supply of electric current to the broil heating element 12b before a zero crossing of the AC current waveform 48 can be extended to minimize exposure of the relay K1 to arcing when interrupting the supply of electric current.

For example, referring to the line AC waveform 48 shown in FIG. 2, conventional controllers for controlling the supply of electric current have traditionally required a long period of time to open a relay to interrupt the supply of electric current to a heating element. This conventional window of time could be about six (6 msec.) milliseconds in length, and often exceeded 8.3 (msec.) milliseconds, which is the duration of a half line cycle of the 60 Hz waveform shown in FIG. 2. For embodiments where the relay turn-off time is about six (6 msec.) milliseconds, the window 58 of time during which the controller 32 could receive the command and actuate the switch Q1 to disconnect the coil 28 from the power source 38 before a zero crossing 60 occurs is short. If the command is received by the controller 32 after that window expires, such as in the shaded region 62, then the zero crossing of the waveform 48 will have occurred and the magnitude of the waveform will be growing when the magnetic field from the coil 28 dissipates enough to open the relay K1. Under such circumstances, the relay K1 will be subjected to significant arcing between the switching element 30 (FIG. 1) and the contact 36 (FIG. 1), thereby exposing the relay K1 to damage. If the conventional relay turn-off time is about 8.3 (msec.) milliseconds or longer, then regardless of when the switching element 30 and contact 36 are separated, then they are likely to be subjected to damage from arcing that can extend over an entire half line cycle of the 60 Hz waveform 48.

In contrast, according to embodiments of the present invention, the flyback voltage V1 is maintained above the minimum flyback voltage by the voltage regulator D2 during the interruption of the supply of electric current to the broil heating element 12b. Thus, the window of time that the command can be issued and the switch Q1 opened before a zero crossing can be extended. For the illustrative 60 Hz waveform 48 in FIG. 2, the relay turn-off time shown by the shaded region 64 is about two (2 msec.) milliseconds. Such a short relay turn-off time extends the available window 66 of time during which the command to interrupt the supply of electric current to the broil heating element 12b can be issued to interrupt said supply of electric current before the next zero crossing 68. As can be seen from FIG. 2, the window 58 of time available for initiating the interruption of the supply of electric current to the broil heating element 12b before a subsequent zero crossing 60 of the waveform of that electric current according to conventional systems is much shorter than the window 66 of time available according to embodiments of the present invention. According to alternate embodiments, the controller 32 can optionally implement a delay in response to the command to time the interruption of the supply of electric current to the broil heating element 12b as close to the immediately-following zero crossing as possible. However, the interruption can optionally occur immediately before the zero crossing occurs such that arcing is minimized during control of the supply of the electric current to the broil heating element 12b.

Illustrative embodiments have been described, hereinabove. It will be apparent to those skilled in the art that the above devices and methods may incorporate changes and modifications without departing from the general scope of this invention. It is intended to include all such modifications and alterations within the scope of the present invention. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A heating appliance for elevating a temperature of a food item, the heating appliance comprising:
   an electric heating element that generates heat in response to conducting an alternating electric current;
   a support to be coupled to the heating appliance adjacent to the electric heating element for supporting the food item within a suitable proximity to the electric heating element to expose the food item to heat from the electric heating element;
   a relay disposed within an electrically-conductive pathway to connect the heating element to an alternating power supply that supplies the alternating electric current delivered to the electric heating element, wherein the relay comprises an inductive actuator that is energizable to control a switching state of the relay;
   a switch that interrupts a supply of electric current from a power source to the inductive actuator of the relay for adjusting the switching state of the relay;
   a selective conductor electrically connected to the inductive actuator for establishing a flyback path that conducts a decaying electric current after interruption of the electric current being supplied to the inductive actuator, wherein the selective conductor interferes with conduction of the electric current from the power source through the flyback path while the electric current is being supplied to the inductive actuator;
   a voltage regulator for maintaining a flyback voltage across the inductive actuator at a level above a minimum flyback voltage in response to interruption of the electric current being supplied to the inductive actuator of the relay; and
   a controller for transmitting a control signal that controls operation of the switch to cause interruption of the alternating electric current being conducted to the heating element through the conductive pathway established by the relay after the alternating electric current being conducted through the relay falls below a peak value during a half cycle of the alternating electric current.

2. The heating appliance of claim 1, wherein the selective conductor is a solid-state, naturally commutated switch.

3. The heating appliance of claim 2, wherein the selective conductor conducts electric current in a single direction.

4. The heating appliance of claim 1, wherein the switch is an electrically-controlled, solid state switching device connected in series with the flyback path between the power source and a reference node.

5. The heating appliance of claim 1, wherein the voltage regulator comprises a zener diode connected in series with the selective conductor.

6. The heating appliance of claim 1, wherein the heating element is disposed within an oven chamber adjacent to a ceiling of the oven chamber or a floor of the oven chamber.

7. The heating appliance of claim 1, wherein the minimum flyback voltage established across the inductive actuator is suitable to allow the decaying electric current to sufficiently decay to a suitably low level for adjusting the switching state of the relay to interrupt the alternating electric current to the heating element in less than about three (3 msec.) milliseconds from a time when the control signal is transmitted by the controller.

8. The heating appliance of claim 1, wherein the decaying electric current conducted through the inductive actuator is a DC electric current, and the minimum flyback voltage established across the inductive actuator is suitable to allow the DC electric current to decay to a low level suitable to adjust the switching state and interrupt the supply of the alternating electric current conducted through the heating element at an end of the half cycle of the alternating electric current during which the control signal is transmitted by the controller.

9. The heating appliance of claim 1, wherein the heating element is disposed adjacent to a substantially horizontal cooktop surface exposed atop of the heating appliance.

10. The heating appliance of claim 1, wherein the voltage regulator is operable to rapidly drop the voltage across the inductive actuator when the level of the voltage drops to the minimum flyback voltage.

11. The heating appliance of claim 1, wherein the controller comprises a timer that issues the command to interrupt the supply of the alternating electric current to the heating element in response to expiration of a predetermined period of time.

12. The heating appliance of claim 1, wherein the inductive actuator generates a magnetic field when energized to magnetically attract a metallic portion of an adjustable switching element of the relay to adjust the relay to a conducting state that establishes the conductive pathway to the electric heating element.

13. The heating appliance of claim 1, wherein the controller transmits the control signal at a first time during the half cycle of the alternating electric current being conducted by the relay after the alternating electric current has reached the peak value, and the flyback voltage maintained by the voltage regulator establishes a rate of decay for the decaying electric current sufficient to adjust the switching state of the relay at a second time approximately at an end of the half cycle of the alternating electric current being conducted by the relay when the alternating electric current reaches a minimum value.

\* \* \* \* \*